United States Patent
Tobita et al.

(10) Patent No.: US 7,264,869 B2
(45) Date of Patent: Sep. 4, 2007

(54) THERMALLY CONDUCTIVE MOLDED ARTICLE AND METHOD OF MAKING THE SAME

(75) Inventors: Masayuki Tobita, Tokyo (JP); Naoyuki Shimoyama, Tokyo (JP); Shinya Tateda, Tokyo (JP)

(73) Assignee: Polymatech Co., Ltd., Chuo-Ku, Tokyo (JP)

( * ) Notice: Subject to any disclaimer, the term of this patent is extended or adjusted under 35 U.S.C. 154(b) by 331 days.

(21) Appl. No.: 10/162,520

(22) Filed: Jun. 4, 2002

(65) Prior Publication Data

US 2002/0197923 A1   Dec. 26, 2002

(30) Foreign Application Priority Data

Jun. 6, 2001   (JP) .............................. 2001-170954

(51) Int. Cl.
  *B32B 27/04*   (2006.01)
  *C01B 31/00*   (2006.01)

(52) U.S. Cl. .................... 428/297.4; 442/74; 264/29.1; 264/29.6

(58) Field of Classification Search ............... 264/29.1, 264/29.4, 443, 430, 459, 413, 480, 425, 450, 264/477, 434, 44, 494, 29.6; 408/323, 327, 408/332; 427/113; 260/29.1; 428/332, 428/327, 323, 297.4; 442/74

See application file for complete search history.

(56) References Cited

U.S. PATENT DOCUMENTS 4,292,224 A * 9/1981 Theodore ..................... 524/263
4,738,872 A * 4/1988 Lee et al. .................... 427/113
5,080,743 A * 1/1992 Odajima ..................... 156/243

FOREIGN PATENT DOCUMENTS

| EP | 0 468 524 A2 | 1/1992 |
|---|---|---|
| EP | 1 041 627 A2 | 10/2000 |
| EP | 1 260 619 A1 | 11/2002 |
| GB | 1 295 289 | 11/1972 |
| JP | 62-131033 | 6/1987 |
| JP | 63-256508 | 10/1988 |
| JP | 02-083207 | 3/1990 |
| JP | 02-083208 | 3/1990 |
| JP | 03-075211 | 3/1991 |
| JP | 04-021508 | 1/1992 |
| JP | 04-149012 | 5/1992 |

(Continued)

OTHER PUBLICATIONS

Hawley's Condensed Chemical Dictionary, Sixth Edition, p. 547.*

*Primary Examiner*—Rena Dye
*Assistant Examiner*—Camie S. Thompson
(74) *Attorney, Agent, or Firm*—Occhiuti Rohlicek & Tsao

(57) ABSTRACT

A thermally conductive molded article is produced by molding a conductive composition into a predetermined shape. The composition includes a polymer matrix and carbon powders. The carbon powders are obtained by graphitizing a polymeric material that has an aromatic ring on its main chain by heating. The carbon powders are aligned in a certain direction in the polymer matrix. Thus, the molded article can be produced easily and effectively that has excellent thermal conductivity in a given direction and that is suitable for use as a heat radiator, heat transfer member, or a component thereof in electronic hardware.

10 Claims, 2 Drawing Sheets

FOREIGN PATENT DOCUMENTS

| | | |
|---|---|---|
| JP | 04-149013 | 5/1992 |
| JP | 04-246456 | 9/1992 |
| JP | 05-017116 | 1/1993 |
| JP | 5-17593 * | 1/1993 |
| JP | 05-017593 | 1/1993 |
| JP | 05-222620 | 8/1993 |
| JP | 05-247268 | 9/1993 |
| JP | 07-109171 | 4/1995 |
| JP | 08-023183 | 1/1996 |
| JP | 08-267647 | 10/1996 |
| JP | 09-156913 | 6/1997 |
| JP | 9-283145 | 10/1997 |
| JP | 09-283955 | 10/1997 |
| JP | 09-324127 | 12/1997 |
| JP | 10-298433 | 11/1998 |
| JP | 11-158378 | 6/1999 |
| JP | 11-279406 | 10/1999 |
| JP | 10298433 * | 10/1999 |
| JP | 2000-169125 | 6/2000 |
| JP | 2000-178016 | 6/2000 |
| JP | 2000-191812 | 7/2000 |
| JP | 2000-195998 | 7/2000 |

* cited by examiner

THERMALLY CONDUCTIVE MOLDED ARTICLE AND METHOD OF MAKING THE SAME

CROSS REFERENCE TO RELATED APPLICATIONS

Pursuant to 35 USC § 119, this application claims the benefit of Japan Application No. 2001-170954 filed Jun. 6, 2001.

BACKGROUND OF THE INVENTION

This invention relates to a thermally conductive molded article that has excellent thermal conductivity and a method of making the same. More particularly, this invention relates to a thermally conductive molded article suitable for use as a heat radiation member, heat transfer member, or a component thereof, each of which effectively dissipates the heat from electronic parts such as semiconductor element, a power supply, and a light source in electronic hardware outside; and a method of making the same.

With recent advancements, miniaturization, and lightening of electronic hardware, semiconductor packages have become more compact and more highly integrated and operated at higher speed. Therefore, the heat generated by the electronic hardware is a very important issue. Generally, to dissipate the heat from heat-generating components to outside, a sheet material and polymer grease are placed between a radiator and one of the followings: a printed circuit board; a semiconductor package; and a heat radiator such as a radiation plate or a heat sink. The sheet material and the polymer grease are generally made of a thermally conductive polymer composition or a thermally conductive molded article.

Such a thermally conductive composition and thermally conductive molded article includes a matrix, such as resin and rubber, and filler that has high thermal conductivity in the matrix. Possible fillers include metal oxide, metal nitride, metal carbide, and metal hydroxide. Examples of such possible fillers include aluminum oxide, boron nitride, silicon nitride, magnesium oxide, zinc oxide, silicon carbide, quartz, and aluminum hydroxide.

Thermally conductive compositions and thermally conductive molded articles that include graphite powders or carbon fibers as filler are known. For example, Japanese Laid-Open Patent Publication No.62-131033 discloses a molded body made of thermally conductive resin in which the resin is filled with graphite powders. Japanese Laid-Open Patent Publication No.4-246456 discloses a composition of polyester resin containing carbon black or graphite. Japanese Laid-Open Patent Publication No.5-17593 discloses a thermally conductive molded body of great mechanical strength in which the carbon fibers are arranged in a certain direction and are impregnated with graphite powder and thermosetting resin. Japanese Laid-Open Patent Publication No.5-222620 discloses a thermally conductive material using pitch-based carbon fibers that have a specific cross section. Japanese Laid-Open Patent Publication No.5-247268 discloses a rubber composition in which is mixed synthetic graphite having a particle size of 1 to 20 µm. Japanese Laid-Open Patent Publication No.9-283955 discloses a thermally conductive sheet in which the graphitized carbon fibers of specific aspect ratio are dispersed in polymer, such as silicone rubber. Japanese Laid-Open Patent Publication No.10-298433 discloses a composition and a thermally conductive sheet in which silicone rubber has, mixed within it, spherical graphite powders having an interplanar spacing of crystals from 0.330 to 0.340 nm. Japanese Unexamined Patent Publication No. 11-158378 discloses a silicone rubber composition that has electrical conductivity and thermal conductivity and in which heated graphite particles are mixed. Japanese Unexamined Patent Publication No. 11-279406 discloses a composition that has good electrical conductivity and thermal conductivity and in which carbon fibers of a given length are mixed in silicone rubber.

As for carbon material that is produced by graphitizing polymer by heating, graphite films that are produced by graphitizing polymeric film by heating to have excellent thermal conductivity and methods of making the graphite films have been widely proposed, as disclosed in Japanese Laid-Open Patent Publication No.3-75211, Japanese Laid-Open Patent Publication No.4-149012, Japanese Laid-Open Patent Publication No.9-156913, and Japanese Laid-Open Patent Publication No.2000-178016. Meanwhile, Japanese Laid-Open Patent Publication No.9-324127 discloses highly thermally conductive powdery graphite, die bond adhesive for a semiconductor element, and a semiconductor device in which the powdery graphite is blended in adhesive thermosetting resin. The powdery graphite is obtained by graphitizing a polymeric film by heating and pulverizing or cutting the resultant graphitized film.

However, for recent high performance electronic parts, due to increase in amount of heat generation, the need for greater thermal conductivity has increased. Therefore, the thermal conductivity is still insufficient for the above-mentioned molded articles that include conventional graphite powder or carbon fibers as thermally conductive filler.

In addition, in relation with miniaturization and lightening of electronic parts, a thermally conductive molded article that has an excellent thermal conductivity in a certain direction is desired. For example, a thermally conductive molded body (e.g. polymer sheet) that is placed between electronic parts of a semiconductor device requires high thermal conductivity in the direction perpendicular to the sheet. Although conventional molded articles that have an excellent thermal conductivity in a certain direction contain graphite powder or carbon fibers, thermal conductivity of them are inadequate.

In the above-mentioned JP No.9-324127, die bond for a semiconductor element contains powdery graphite in thermosetting resin. The powdery graphite is dispersed randomly in the resin. Therefore, the molded article does not have good thermal conductivity in a certain direction.

An object of the present invention is to provide a thermally conductive molded article that has good thermal conductivity in a given direction and that is suitable for use as a heat radiation member, heat transfer member, or a component thereof in electronic hardware; and a method of making the molded article.

BRIEF SUMMARY OF THE INVENTION

A thermally conductive molded article is produced by molding a conductive composition into a predetermined shape. The composition includes a polymer matrix and carbon powders. The carbon powders are obtained by graphitizing a polymeric material that has an aromatic ring on its main chain by heating. In the molded article, the carbon powders are aligned in a certain direction in the polymer matrix.

Other aspects and advantages of the invention will become apparent from the following description, taken in conjunction with the accompanying drawings, illustrating by way of example the principles of the invention.

BRIEF DESCRIPTION OF THE SEVERAL VIEWS OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
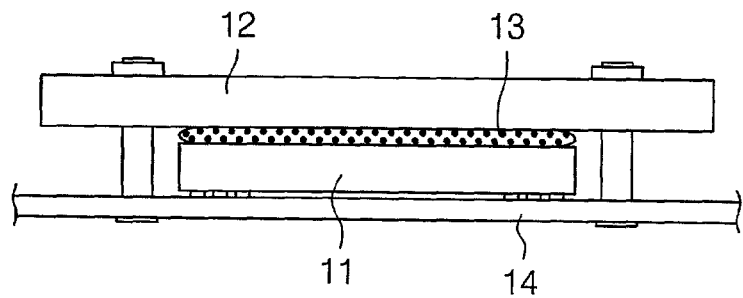
FIG. 1 is a side view of one application of a thermally conductive molded article.

Embodiments of the present invention are described in detail below.

1. Thermally Conductive Molded Article

A thermally conductive molded article is produced by molding a thermally conductive composition into a predetermined shape. The composition includes a polymer matrix and carbon powders as filler. The carbon powders are obtained by graphitizing polymeric material having an aromatic ring on its main chain aromatic by heating. The carbon powders are aligned in a certain direction in the polymer matrix.

1.A Carbon Powders

The carbon powders are obtained by graphitizing polymeric material having an aromatic ring on its main chain aromatic by heating. As used herein, an aromatic ring generally refers to a ring that belongs to an aromatic group and means a group of organic compounds including aromatic hydrocarbons, such as benzene ring, naphthalene ring, and anthracene ring, and derivatives thereof. A polymeric material having an aromatic ring on its main chain refers to a polymer that has an aromatic ring on its main chain and in which polymer chains are connected in linear, stranded or mesh form.

The polymeric material is not particularly limited to, but may include, at least one polymeric fiber selected from the group consisting of polybenzazole, aromatic polyamide, aromatic polyimide, polyphenylene sulfide, and wholly aromatic polyester. Alternatively, the polymeric material may include at least one polymeric film selected from the group consisting of polybenzazole, aromatic polyamide, aromatic polyimide, polyphenylene sulfide, and wholly aromatic polyester.

The reason for using the polymeric material having an aromatic ring on its main chain is that such polymeric material is hard to melt upon heating due to its heat resistance and that it is easily graphitized upon heating and thus produces highly thermally conductive carbon powder in which graphite structure is highly developed.

On the other hand, when a conventional polymeric material having no aromatic ring on its main chain is used as a raw material, for example, rayon fiber, polyacrylonitrile fiber, phenol fiber, polyolefin film, aliphatic nylon film, polystyrene film or polyvinyl chloride film, the graphitization upon heating is difficult. Thus, highly thermally conductive carbon powder cannot be obtained.

Another reason for using the polymeric material having an aromatic ring on its main chain is that carbon fiber which has excellent thermal conductivity in a certain direction can be obtained. Specifically, in the polymeric material (e.g. polymeric fiber or film) having an aromatic ring on its main chain, polymer chains are aligned in a certain direction (e.g. axial direction of the polymeric fiber or planar direction of the polymeric film). Therefore, when the polymeric material is graphitized by heating, carbon powder can be produced in which graphite planes highly develop in the running direction of the polymer chains. The resultant carbon powder has excellent thermal conductivity particularly in the direction perpendicular to C-axis of the hexagonal graphite crystal structure, or in the direction parallel to the basal plane (graphite plane). Thus, by aligning the carbon powders in a certain direction in the polymer matrix, the thermally conductive molded article that exhibits high thermal conductivity in the direction parallel to the graphite plane can be obtained.

The polymeric material having an aromatic ring on its main chain is more preferably at least one polymeric fiber selected from the group consisting of polybenzazole, aromatic polyamide, aromatic polyimide, polyphenylene sulfide, and wholly aromatic polyester. Alternatively, the polymeric material is more preferably at least one polymeric film selected from the group consisting of polybenzazole, aromatic polyamide, aromatic polyimide, polyphenylene sulfide, and wholly aromatic polyester. Most preferably, the polymeric fiber is at least one fiber or at least one polymeric film selected from the group consisting of polybenzazole, aromatic polyimide, and aromatic polyamide. The polymeric fiber having an aromatic ring on its main chain tends to be graphitized easier upon heating as it has more aromatic rings. Thus, carbon powder that has extremely excellent thermal conductivity is obtained.

As used herein, polybenzazole refers to a polymer made of polybenzazole polymer. The polybenzazole fiber is generally excellent in strength, modulus of elasticity, heat resistance, flame resistance, and electric insulation. The polybenzazole polymer (PBZ) refers to polybenzooxazole homopolymer (PBO), polybenzothiazole homopolymer (PBT); or random copolymer, sequential copolymer, block copolymer, or graft copolymer of PBO and PBT. PBZ may be synthesized by a known method.

The carbon fiber takes the form of fiber (including a pulverized product or a cut product that keeps the fibrous form), a scale, a fracture, a sphere, an irregular powder, a whisker, a micro coil, or a nanotube. However, other forms are also applicable.

The average particle size of the carbon powders is not particularly limited but is preferably 1-500 µm. The powders in this range are easily produced industrially and have high thermal conductivity. When the average particle size of the carbon powders is smaller than 1 µm, the contact of the carbon powders in the matrix is reduced and a heat transfer becomes insufficient. This reduces the thermal conductivity of the resultant thermally conductive molded article. When the average particle size is larger than 500 μm, the carbon powders are too bulky to be mixed in the matrix at a high concentration. The average particle size can be calculated from the particle size distribution by laser diffractometry model.

From X-ray diffractometry, it is preferred that the carbon powders have an interplanar spacing (d002) of graphite planes of less than 0.3370 nm. When the interplanar spacing (d002) is less than 0.3370 nm, carbon powders and a thermally conductive molded article that have higher thermal conductivity can be achieved. When the interplanar spacing (d002) is 0.3370 nm or greater, the thermal conductivity is inadequate. Accordingly, a molded body that has high thermal conductivity cannot be obtained by using such carbon powders as thermally conductive filler. The lower limit of the interplanar spacing (d002) is a theoretical value of 0.3354 nm.

In the X-ray diffractometry, a diffractometry pattern of the carbon powders is measured by using CuK alpha as a X-ray source and highly purified silicon as a standard material. The interplanar spacing (d002) is calculated from the peak position and half-value width of the (002) diffractometry pattern. This calculation is based on a method pursuant to Japan Society for the Promotion of Science.

For the purpose of improvement of the surface of the carbon powders, the surface of the powders may be previously degreased, washed, oxidized by electrolytic oxidation, or treated with a known coupling agent or a known sizing agent. This improves of the carbon powders to the matrix or the peel strength from the matrix at the interface.

The surface of the carbon powders may also be coated with metal or ceramics by various methods such as electroless plating; electroplating; physical vapor evaporation such as vacuum evaporation, sputtering and ion plating; chemical vapor deposition, spraying; coating; immersion; and mechanochemical method in which fine particles are mechanically fixed on the surface of the carbon powders.

1.B Polymer Matrix

The polymeric material may be preferably selected from thermoplastic resin, thermoplastic elastomer, thermosetting resin, and vulcanized rubber according to its applications or required characteristics.

The thermoplastic resin includes polyethylene, polypropylene, ethylene-α-olefin copolymer such as ethylene-propylene copolymer, polymethylpentene, polyvinyl chloride, polyvinylidene chloride, polyvinyl acetate, ethylene vinyl acetate copolymer, polyvinyl alcohol, polyacetal, fluororesins such as polyvinylidene fluoride and polytetrafluoroethylene, polyethylene terephthalate, polybutylene terephthalate, polyethylene naphthalate, polystyrene, polyacrylonitrile, styrene acrylonitrile copolymer, ABS resin, polyphenylene ether (PPE) resin and modified PPE resin, aliphatic and aromatic polyamides, polyimide, polyamide imide, polymethacrylic acid and polymethacrylates such as polymethyl methacrylate, polyacrylic acids, polycarbonate, polyphenylene sulfide, polysulfone, polyether sulfone, polyether nitrile, polyether ketone, polyketone, liquid crystal polymer, silicone resin, and ionomer.

The thermoplastic elastomer includes repeatedly moldable and recyclable thermoplastic elastomers such as styrene-butadiene or styrene-isoprene block copolymers and hydrogenated polymer thereof, styrenic thermoplastic elastomer, olefinic thermoplastic elastomer, vinyl chloride thermoplastic elastomer, polyester thermoplastic elastomer, polyurethane thermoplastic elastomer, and polyamide thermoplastic elastomer.

The thermosetting resin includes epoxy resin, polyimide, bis-maleimide resin, benzocyclobutene, phenol resin, unsaturated polyester, diallyl phthalate, silicone resin, polyurethane, polyimide silicone, thermosetting polyphenylene ether resin and modified PPE resin.

The vulcanized rubber includes natural rubber, butadiene rubber, isoprene rubber, styrene-butadiene copolymer rubber, nitrile rubber, hydrogenated nitrile rubber, chloroprene rubber, ethylene-propylene rubber, chlorinated polyethylene, chlorosulfonated polyethylene, butyl rubber and halide butyl rubber, fluorine rubber, urethane rubber, and silicone rubber.

In terms of temperature characteristics such as thermal resistance and electric reliability, the polymer matrix is preferably at least one material selected from the group consisting of silicone rubber, epoxy resin, polyurethane, unsaturated polyester, polyimide, bis-maleimide, benzocyclobutene, fluororesin, polyphenylene ether resin and thermoplastic elastomer. More preferably, the polymer matrix is at least one material selected from the group consisting of silicone rubber, epoxy resin, unsaturated polyester resin, polyimide, polyurethane and thermoplastic elastomer.

In an application for a wiring board where permittivity and dielectric loss tangent are small and frequency characteristic is required, fluororesin, thermosetting polyphenylene ether resin, modified PPE resin, and polyolefin resin are desired. To obtain a flexible thermally conductive polymer sheet, a polymer matrix such as low-hardness vulcanized rubber and low-hardness thermoplastic elastomer may be used.

One or more of the above polymer matrices can be used as appropriate. Further, a polymer alloy formed of a plurality of these polymer matrices may be used. The methods of cross-linking thermosetting resin or vulcanized rubber are not limited to thermosetting but include known methods such as light setting and moisture setting.

1.C Thermally Conductive Composition

A thermally conductive composition including the polymer matrix and the carbon powders is described below.

The content of the carbon powders is preferably 1 to 800 parts by weight, more preferably 1 to 500 parts by weight, and most preferably 40 to 300 parts by weight relative to 100 parts by weight of the polymer matrix, although it depends on the required characteristics of the intended end product. When the content is less than 1 part by weight, the thermal conductivity of the resultant composition is lowered and radiating property is decreased. When the content is more than 500 parts by weight, the viscosity of the composition is increased, which makes it difficult to disperse the carbon powders in the matrix uniformly. Also, gas bubbles are inevitably included in the matrix.

Other than the carbon powders, the thermally conductive composition may also include other thermally conductive materials, an incombustible agent, a softening agent, a colorant, and a stabilizer as required. The other thermally conductive materials include the following:

metal and ceramic such as silver, copper, gold, aluminum oxide, magnesium oxide, boron nitride, aluminum nitride, silicon nitride, silicon carbide, and aluminum hydroxide metal-coated resin conventional graphitized carbon powder other than the above-mentioned carbon powder non-graphitized carbon powder natural graphite synthetic graphite meso-carbon microbead The carbon powders, graphites, and beads may be in the form of, for example, spherical powder, powder, fiber, needle, a scale, a whisker, a microcoil, single-walled, or multi-walled nanotube.

In an application where electric non-conductance is particularly required for an end product, the composition preferably includes electrical insulative filler selected from the group consisting of aluminum oxide, magnesium oxide, boron nitride, aluminum nitride, silicon nitride, silicon carbide and aluminum hydroxide. To decrease the viscosity of the composition, a volatile organic solvent, low-viscosity softener, or a reactive plasticizer may be added to the composition. This facilitates the alignment of the carbon powders in a certain direction in the polymer matrix.

1.D Thermally Conductive Molded Article

A thermally conductive molded article that is formed by molding the above-mentioned composition into a predetermined shape is described.

In the thermally conductive molded article, the carbon powders are aligned in the polymer matrix in a certain direction. Thus, the molded article has high thermal conductivity in the direction of the arranged carbon powders (e.g. a direction parallel to the graphite plane) and has more excellent thermal conductivity. As used herein, the alignment of the carbon powders in a certain direction means that graphite planes of the hexagonal graphite crystal structure of carbon powders are aligned in a certain direction. This alignment of the carbon powders may be confirmed, for example, on x-ray crystal analysis by x-ray diffractometry.

When the molded article is a sheet, its hardness depends on the required characteristics of the end product. For stress relaxation and tracking characteristics during use, greater flexibility, or lower hardness, is advantageous. Specifically, the hardness of the molded body is preferably 70 or less by Shore A hardness. More preferably, the hardness is 40 or less by Shore A hardness. Most preferably, the molded body has an Asker C hardness of 30 or less and includes a gel silicone rubber or a thermoplastic elastomer as polymer matrix.

The thickness of the sheet-like molded body is not limited but it is preferably 50 μm-10 mm, and more preferably, 100 μm-5 mm. When the thickness is less than 50 μm, the sheet is hard to manufacture and handle. When the thickness is more than 10 mm, thermal resistance becomes great, which is undesirable.

The application of the thermally conductive molded article is described below.

In electronic hardware, the heat generates from electronic parts such as semiconductor element, a power supply, and a light source. The thermally conductive molded article may be used as a heat radiation member, heat transfer member, or a component thereof for dissipating such heat effectively. Specifically, the molded article that is processed into a sheet is placed between a radiation member such as radiator and a heat-generating member such as a semiconductor element. Alternatively, the molded article may be used to form a radiation plate, parts for semiconductor package, a heat sink, a heat spreader, a die pad, a printed circuit board, parts for a cooling fan, a heat pipe, and a housing.

Figure 2:
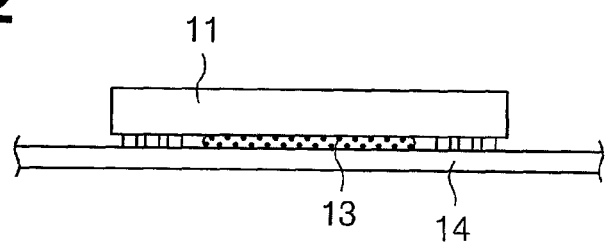
FIG. 2 is a side view of another application of a thermally conductive molded article.
Figure 3:
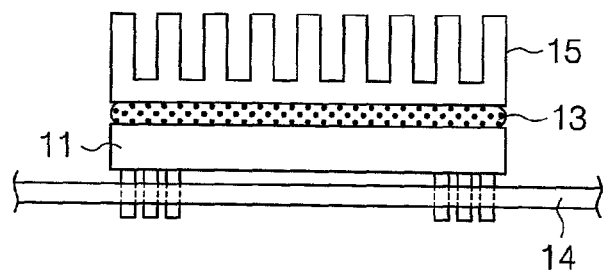
FIG. 3 is a side view of another application of a thermally conductive molded article.
Figure 4:
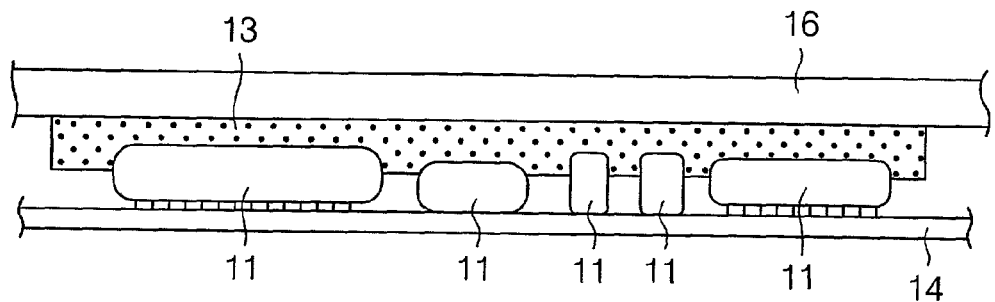
FIG. 4 is a side view of another application of a thermally conductive molded article.

FIGS. 1 to 4 show several applications in which a sheet-like thermally conductive molded article is used as a heat transfer member. In FIG. 1, a sheet-like thermally conductive molded article 13 is placed between a semiconductor element 11 (Ball Grid Array semiconductor package), which is mounted on the printed circuit board 14, and a radiation plate 12. In FIG. 2, a sheet-like thermally conductive molded article 13 is placed between a semiconductor element 11 (Chip Size semiconductor package) and a printed circuit board 14. In FIG. 3, a sheet-like thermally conductive molded article 13 is placed between a semiconductor element 11 (Pin Grid Array semiconductor package), which is mounted on the printed circuit board 14, and a heat sink 15. In FIG. 4, a sheet-like thermally conductive molded article 13 is placed between a plurality of semiconductor elements 11, each of which is mounted on the printed circuit board 14, and a housing 16.

Figure 5:
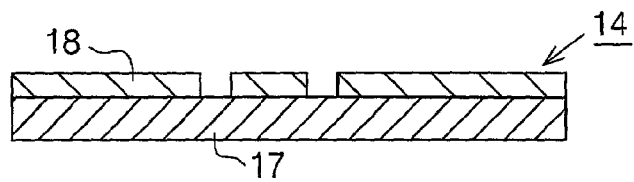
FIG. 5 is a sectional view of another application of a thermally conductive molded article.

FIG. 5 illustrates an application where a printed circuit board 14 is formed of the thermally conductive molded article. The printed circuit board 14 includes a substrate 17 and a electro-conductive layer 18 which is laid on the substrate 17 via an insulative layer (not shown). The substrate 17 is formed by shaping the above-mentioned thermally conductive composition into a plate. The electro-conductive layer 18 comprises a copper foil.

2. Method of Making the Thermally Conductive Molded Article

2.A Method of Making Carbon Powders

The carbon powders are produced by graphitizing the above-mentioned polymeric fiber of the present invention by heating, and pulverizing or cutting the resultant carbon fiber or film.

The heating temperature should be at least 2500 degree C. When the temperature is lower than 2500 degree C., graphitization becomes insufficient and carbon powders that have high thermal conductivity cannot be obtained. Preferably, the heating is conducted under vacuum or in an inert gas, such as argon gas or nitrogen gas. When not heated under vacuum or in an inert gas, the polymeric material having an aromatic ring on its main chain may be undesirably degenerated by oxidation. In practice, the polymeric material is preferably heated for a given time at a high temperature from 2800 to 3200 degree C. in argon gas. This actively promotes graphitization to produce highly thermally conductive carbon powder in which graphite structure highly develops. The process is not particularly limited to specific rates of heating temperature or to a specific treating period.

To pulverize or cut the polymeric material, pulverizing machines are available, such as a Victory mill, a jet mill, and a high-speed rotation mill or cutters for chopping fibers. To make the pulverization or cutting effective, common to each of above means, it is advantageous if a rotor of each machine that has blades that rotate at high speed to cut the fibers in a direction perpendicular to the fibers. The average particle size of the pulverized or cut carbon powders is changed by adjusting the rotation number of the rotor or an angle of the blades. Grinding machines such as a ball mill could be used for pulverizing the fibers. This pulverization or cutting process may be conducted either before or during the heating of the fiber.

2.B. Method of Making Thermally Conductive Molded Article

The intended thermally conductive composition is obtained by mixing the above-mentioned carbon powders with the polymer matrix and stirring, degassing or kneading it as desired. In mixing, known mixing machines or kneading machines such as a blender, a mixer, a roller, or an extruder may be used. Preferably, gas bubble is removed by depressurization or pressurization during the mixing.

The magnetic field is applied to the thermally conductive composition with the carbon powders aligned in a certain direction. Then the composition is hardened and molded into a predetermined shape to produce a thermally conductive molded article.

The method for molding the composition includes known methods such as compression molding, extrusion molding, injection molding, casting molding, blow molding, blade molding, and calendering molding. When the composition is liquid, it may be processed by painting, printing, dispensing, and potting other than the above methods. When the composition is molded into a sheet, compression molding, extrusion molding, blade molding, and calendering molding are preferred.

To align the carbon powders in the composition in a certain direction, flowing field or shearing field, magnetic field, or electric field may be used. Among these, it is preferred to apply the magnetic field to the composition from outside to align the carbon powders parallel to magnetic line of force because this method is efficient and the direction of the carbon powders can be determined arbitrarily. This method is also advantageous over the method by the above-mentioned mechanical alignment in that the carbon powders can be more intensively aligned in a certain direction.

In manufacturing the molded article by using magnetic field, for example, a thermally conductive composition is injected into a cavity of the metal. Then the magnetic field is applied to the composition to harden it with the carbon powders in it are aligned in a certain direction.

Figure 6:
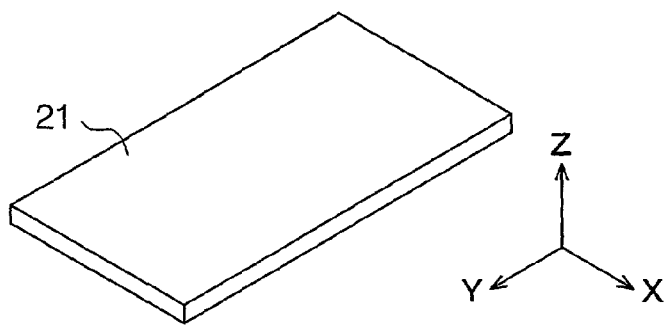
FIG. 6 is a perspective view of a plate-like thermally conductive molded article.
Figure 7A:
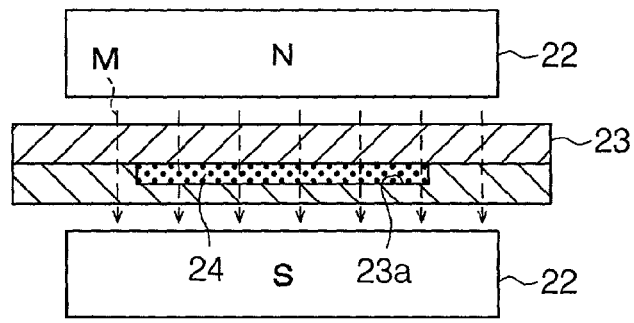
FIG. 7A is a partial sectional view illustrating a method of manufacturing a thermally conductive molded article.
Figure 7B:
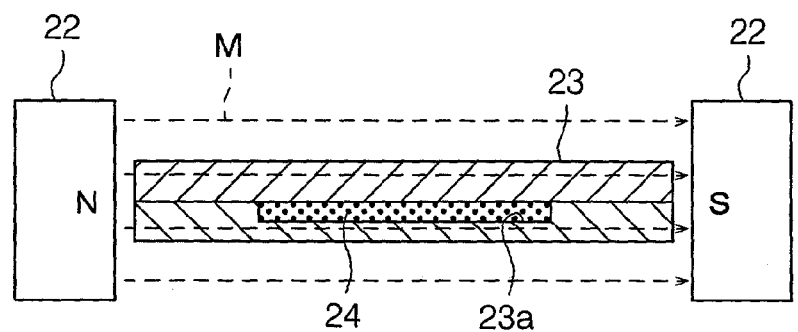
FIG. 7B is a partial sectional view illustrating another method of manufacturing a thermally conductive molded article.

FIG. 6 shows a plate-like thermally conductive molded article 21. Suppose that the carbon powders are aligned in the direction perpendicular to the molded body 21 (i.e. Z-axis direction in FIG. 6). In this case, as shown in FIG. 7A, a pair of magnetic field producing devices 22 are placed so that the direction of magnetic line of force M corresponds to the direction perpendicular to the molded body 21 (Z-axis direction in FIG. 6). The magnetic field is applied to the composition 24 that is injected in a cavity 23a of the metal mold 23. Also, suppose that the carbon powders are aligned in the direction horizontal to the molded body 21 (X- or Y-axis direction in FIG. 6). In this case, as shown in FIG. 7B, a pair of magnetic field producing devices 22 are placed so that the direction of magnetic line of force M corresponds to the direction horizontal to the molded body 21 (See FIG. 6). The magnetic field is applied to the composition 24 that is injected in a cavity 23a of the metal mold 23.

For example, a permanent magnet, an electromagnet, and a coil are preferably used as a magnetic field producing device 22. Although the magnetic flux density of the magnetic field produced by the devices 22 is determined properly based on the viscosity of the composition or the average particle size of the carbon powders, it is preferably from 0.05 to 30 tesla, more preferably 0.05 tesla or more, most preferably 2 tesla or more. When the magnetic flux density is 0.5 tesla or more, the practical alignment of the carbon powders can be achieved to obtain the intended highly thermally conductive molded body.

Although a pair of the devices 22 is placed on both sides of the metal mold 23 in the embodiments of FIG. 7A and 7B, the device 22 may be placed on one side in each embodiment. In addition, although the devices 22 are placed so that a north pole and a south pole of them face to each other, the devices 22 may be placed in either a south pole-to-south pole position or a north pole-to-north pole position. Further, The magnetic line of force M is not necessarily a straight line. The line may be a curved line or a square line. Also, the device(s) 22 may be placed so that the magnetic line of force M extends at least two directions as well as one direction.

The advantages of the above embodiments are described below.

The polymeric material that has an aromatic ring on its main chain is used as a raw material. Thus, highly thermally conductive carbon powders in which graphite structure highly develops can be produced. The polymeric material has polymer chains aligned in a certain direction. Therefore, by graphitizing the polymeric material by heating, the carbon powders can be obtained in which graphite planes highly develop in the running direction of the polymer chain and that have excellent thermal conductivity in a certain direction (in a direction parallel to the graphite plane).

The polymeric material having an aromatic ring on its main chain is at least one polymeric fiber selected from the group consisting of polybenzazole, aromatic polyamide, aromatic polyimide, polyphenylene sulfide, and wholly aromatic polyester. Alternatively, the polymeric material is at least one polymeric film selected from the group consisting of polybenzazole, aromatic polyamide, aromatic polyimide, polyphenylene sulfide, and wholly aromatic polyester. Thus, carbon powder that has extremely excellent thermal conductivity is obtained.

When the carbon powders have an interplanar spacing (d002) of graphite planes of less than 0.3370 nm by X-ray diffractometry, carbon powders and a thermally conductive molded article that have higher thermal conductivity can be achieved. Although the reason for this has not been revealed, it is supposed that the carbon fibers and the molded article, which has the carbon powders are dispersed in the polymer matrix, have a thermal passage which has strong relation with the microstructure of the graphitized carbon powders.

The carbon powders are aligned in a certain direction in the polymer matrix. Thus, the thermally conductive molded article that exhibits high thermal conductivity in the direction parallel to the graphite plane can be obtained. The molded article that has anisotropic thermal conductivity and that has extremely high thermal conductivity in a certain direction can be obtained.

The average particle size of the carbon powders is from 1 to 500 μm. The powders in this range are easily produced industrially and are contained in the polymer matrix at high concentration. The thermal conductivity of resultant molded body is improved.

The content of the carbon powders is 1 to 500 parts by weight relative to 100 parts by weight of the polymer matrix. This prevents the increased viscosity of the composition and contamination of gas bubbles while facilitates the uniform dispersion of the carbon powders in the polymer matrix and alignment of the carbon powders in a certain direction in the polymer matrix. Thus, the thermally conductive molded article that has improved thermal conductivity may be obtained.

The magnetic field is applied to the composition including the polymer matrix and the carbon powders and the composition is hardened with the carbon powders aligned in a certain direction. This method is advantageous over the method by the above-mentioned mechanical alignment in that the direction of the carbon powders can be determined arbitrarily and that the carbon powders can be more intensively aligned in a certain direction. The molded article can be produced easily and effectively.

EXAMPLES

The above-mentioned embodiments are further described with reference to Samples, Examples and Comparative examples, which are not intended to limit the scope of the present invention in any way.

In the following Examples and Comparative examples, flat plate-like thermally conductive molded articles as shown in FIG. 6 are produced. The direction perpendicular to the molded body is defined as Z-axis direction. One of the directions horizontal to the molded sheet is defined as X-axis direction; the other is defined as Y-axis direction.

(Sample 1, Carbon Powders)

As a polymeric material having an aromatic ring on its main chain, polybenzazole fiber (Toyobo Co., Ltd., a tradename ZYLON™ HM: polybenzooxazole fiber) was used. The fiber was heated at 3000 degree C. in an argon gas for two hours to be graphitized to produce carbon powders. The resultant carbon powders were pulverized with a high-speed rotation mill to form carbon powders (Sample 1).

The carbon powders had a fiber diameter of 9 μm, an average particle size of 50 μm, and an interplanar spacing (d002) between the graphite planes of 0.3360 nm by X-ray diffractometry.

(Sample 2, Carbon Powders)

As a polymeric material an aromatic polyimide film (Du Pont-Toray Co., Ltd., a tradename KAPTON™ a thickness of 25 μm) was used. The polymeric film heated at 3000 degree C. in an argon gas for 2 hours to be graphitized to produce a graphite film. The resultant graphite film was pulverized with a high-speed rotation mill to form carbon powders (Sample 2).

The carbon powders had an average particle size of 45 μm. The interplanar spacing (d002) between the graphite planes by X-ray diffractometry was 0.3368 nm.

(Sample 3, Carbon Powders)

A petroleum mesophase pitch that is optically anisotropic and has the specific gravity of 1.25 was used as a raw material. A die, which includes the 3 mm wide slits between which passages with 0.2 mm diameter spinning holes are arranged, was used. The mesophase pitch was melted and blown by the heated air out of the slits. The melted pitch was spun at a spinning temperature of 360 degree C. to produce pitch-based fibers having an average diameter of 13 μm.

The spun fibers were collected on the belt as a mat. The mat was heated in the air from a room temperature to 300 degree C. at an average rising rate of 6 degree C./min to infusibilize the fibers. Then the infusibilized fibers were lightly carbodized at 700 degree C. and pulverized with a high-speed rotation mill to form pulverized carbon powders having an average size of 20 μm.

The pulverized fibers were heated in an argon gas up to 2300 degree C., kept at 2300 degree C. for 40 minutes, further heated up to 3100 degree C. at a rising rate of 3 degree C./min, kept at 3100 degree C. for one hour, and cooled down to form carbon powders (Sample 3).

The carbon powders had a fiber diameter of 9 μm, an average particle size of 50 μm, and an interplanar spacing (d002) between the graphite planes of 0.3368 nm by X-ray diffractometry.

The following Examples 1 to 7 are thermally conductive molded articles in each of which the carbon powders, which are obtained by graphitizing the polymeric material having an aromatic ring on its main chain by heating, are aligned in a certain direction in the polymer matrix. Comparative example 1 is a thermally conductive molded article in which the carbon powders are not aligned. Comparative example 3 is a thermally conductive molded article in which low magnetic field at magnetic flux density of 1.5 was applied and the carbon powders were not fully aligned. Comparative example 2, 4, and 5 are thermally conductive molded articles in each of which the conventional carbon powders, which is produced from raw mesophase pitch, are aligned in a certain direction in the polymer matrix.

Example 1

As a polymer matrix, unsaturated polyester resin (NIPPON SHOKUBAI CO., LTD, a tradename EPOLAC™) was used. As thermally conductive filler, the carbon powders of Sample 1 with their surfaces treated with a silane coupling agent was used. 125 parts by weight of the carbon fibers was mixed and dispersed in 100 parts by weight of the matrix. The mixture was degassed under vacuum to prepare a thermally conductive composition.

The composition was then injected in a cavity of the metal mold of a predetermined shape. A magnetic field (magnetic flux density of 10 tesla) was applied so that the direction of the magnetic line of force corresponded to the direction perpendicular to a potential thermally conductive molded article (Z-axis direction). After the carbon powders were fully aligned in the composition, the composition was thermally hardened. A plate-like thermally conductive molded article having 1.5 mm×20 mm×20 mm (thickness×depth×width) was produced.

In this molded article, the carbon powders were arranged in the direction perpendicular to the molded article (Z-axis direction). The measured thermal conductivities of the molded body in the perpendicular direction (Z-axis direction) and the horizontal direction (X-axis direction) were 18.7W/(m·K) and 3.1W/(m·K), respectively.

Example 2

A plate-like thermally conductive molded article was produced as in Example 1, except that the direction of magnetic line of force corresponded to the direction horizontal to a potential molded article (X-axis direction).

In this molded article, the carbon powders were arranged in the direction horizontal to the molded article (X-axis direction). The measured thermal conductivities of the molded body in the perpendicular direction (Z-axis direction) and the horizontal directions (X-axis and Y-directions) were 3.0W/(m·K), 17.8W/(m·K), and 3.2W/(m·K), respectively.

Comparative Example 1

A plate-like thermally conductive molded article was produced as in Example 1, except that the magnetic field was not applied.

In this molded article, the carbon powders were randomly dispersed instead of aligning in a certain direction. The measured thermal conductivities of the molded body in the perpendicular direction (Z-axis direction) and the horizontal direction (X-axis direction) were 1.7W/(m·K) and 4.8W/(m·K), respectively.

The thermal conductivities of the molded body of Example 1, Example 2, and Comparative example 1 are shown in Table 1.

TABLE 1

|  | Ex. 1 | Ex. 2 | Comp. 1 |
|---|---|---|---|
| filler | Sample 1 | Sample 1 | Sample 1 |
| matrix | polyester | polyester | polyester |
| magnetic field (T) | 10 T | 10 T | 0 T |

TABLE 1-continued

|  | Ex. 1 | Ex. 2 | Comp. 1 |
|---|---|---|---|
| direction of the carbon powders | perpendicular (Z-axis) | horizontal (X-axis) | random |
| conductivity (W/(m · K)) |  |  |  |
| Z-axis direction | 18.7 | 3.0 | 1.7 |
| X-axis direction | 3.1 | 17.8 | 4.8 |
| Y-axis direction | — | 3.2 | — |

Example 3

As a polymer matrix, liquid epoxy resin (Three Bond Co., Ltd., a tradename TB2280C) was used. As thermally conductive filler, the carbon powders of Sample 1 with their surfaces treated with a silane coupling agent was used. 100 parts by weight of the carbon fibers was mixed and dispersed in 100 parts by weight of the matrix. The mixture was degassed under vacuum to prepare a thermally conductive composition.

The composition was then injected in a cavity of the metal mold of a predetermined shape. A magnetic field (magnetic flux density of 8 tesla) was applied so that the direction of the magnetic line of force corresponded to the direction perpendicular to a potential thermally conductive molded article (Z-axis direction). After the carbon powders were fully aligned in the composition, the composition was thermally hardened. A plate-like thermally conductive molded article having 3 mm×20 mm×20 mm (thickness×depth×width) was produced.

In this molded article, the carbon powders were arranged in the direction perpendicular to the molded article (Z-axis direction). The measured thermal conductivities of the molded body in the perpendicular direction (Z-axis direction) and the horizontal direction (X-axis direction) were 12.4W/(m·K) and 3.6W/(m·K), respectively.

Example 4

A plate-like thermally conductive molded article was produced as in Example 3, except that the carbon powders of Sample 2 were used as thermally conductive filler.

In this molded article, the carbon powders were arranged in the direction perpendicular to the molded article (Z-axis direction). The measured thermal conductivities of the molded body in the perpendicular direction (Z-axis direction) and the horizontal direction (X-axis direction) were 11.2W/(m·K) and 2.9W/(m·K), respectively.

Comparative Example 2

A plate-like thermally conductive molded article was produced as in Example 3, except that the carbon powders of Sample 3 were used as thermally conductive filler.

In this molded article, the carbon powders were arranged in the direction perpendicular to the molded article (Z-axis direction). The measured thermal conductivities of the molded body in the perpendicular direction (Z-axis direction) and the horizontal directions (X-axis and Y-directions) were 8.2W/(m·K), 2.5W/(m·K), and 3.0W/(m·K), respectively.

The thermal conductivities of the molded body of Example 3, Example 4, and Comparative example 2 are shown in Table 2.

TABLE 2

|  | Ex. 3 | Ex. 4 | Comp. 2 |
|---|---|---|---|
| filler | Sample 1 | Sample 2 | Sample 3 |
| matrix | liquid epoxy | liquid epoxy | liquid epoxy |
| magnetic field (T) | 8 T | 8 T | 8 T |
| direction of the carbon powders | perpendicular (Z-axis) | perpendicular (Z-axis) | perpendicular (Z-axis) |
| conductivity (W/(m · K)) |  |  |  |
| Z-axis direction | 12.4 | 11.2 | 8.2 |
| X-axis direction | 3.6 | 2.9 | 2.5 |
| Y-axis direction | — | — | 3.0 |

Example 5

As a polymer matrix, liquid silicone rubber (GE TOSHIBA SILICONES CO., LTD, a tradename TSE3070) was used. As thermally conductive filler, the carbon powders of Sample 1 with their surfaces treated with a silane coupling agent was used. 110 parts by weight by weight of the carbon fibers and 60 parts by weight of aluminum oxide powder (SHOWA DENKO K. K., a tradename AS-20) were mixed and dispersed in 100 parts by weight of the matrix. The mixture was degassed under vacuum to prepare a thermally conductive composition.

The composition was then injected in a cavity of the metal mold of a predetermined shape. A magnetic field (magnetic flux density of 12 tesla) was applied so that the direction of the magnetic line of force corresponded to the direction perpendicular to a potential thermally conductive molded article (Z-axis direction). After the carbon powders were fully aligned in the composition, the composition was thermally hardened. A plate-like thermally conductive molded article having 0.5 mm×20 mm×20 mm (thickness×depth×width) and an Asker C hardness of 16 was produced.

In this molded article, the carbon powders were arranged in the direction perpendicular to the molded article (Z-axis direction). The measured thermal conductivities of the molded body in the perpendicular direction (Z-axis direction) and the horizontal direction (X-axis direction) were 18.4W/(m·K) and 3.5W/(m·K), respectively.

Example 6

A plate-like thermally conductive molded article (an Asker C hardness of 15) was produced as in Example 5, except that the direction of magnetic line of force corresponded to the direction horizontal to a potential molded article (X-axis direction).

In this molded article, the carbon powders were arranged in the direction horizontal to the molded article (X-axis direction). The measured thermal conductivities of the molded body in the perpendicular direction (Z-axis direction) and the horizontal directions (X-axis and Y-directions) were 2.9W/(m·K), 18.2W/(m·K), and 3.1W/(m·K), respectively.

Comparative Example 3

A plate-like thermally conductive molded article was produced as in Example 5, except that the magnetic flux density of the applied magnetic field was 1.5 tesla.

The carbon powders in the resultant molded article were not fully aligned. The measured thermal conductivities of the molded body in the perpendicular direction (Z-axis direction) and the horizontal direction (X-axis direction) were 2.9W/(m·K) and 3.4W/(m·K).

Comparative Example 4

A plate-like thermally conductive molded article was produced as in Example 5, except that the carbon powders of Sample 2 were used as thermally conductive filler.

In this molded article, the carbon powders were arranged in the direction perpendicular to the molded article (Z-axis direction). The measured thermal conductivities of the molded body in the perpendicular direction (Z-axis direction) and the horizontal direction (X-axis direction) were 11.6W/(m·K) and 2.9W/(m·K), respectively.

The thermal conductivities of the molded body of Example 5, Example 6, Comparative example 3, and Comparative example 4 are shown in Table 3.

TABLE 3

|  | Ex. 5 | Ex. 6 | Comp. 3 | Comp. 4 |
|---|---|---|---|---|
| filler | Sample 1 | Sample 1 | Sample 1 | Sample 3 |
| matrix | liquid silicone | liquid silicone | liquid silicone | liquid silicone |
| magnetic field (T) | 12 T | 12 T | 1.5 T | 12 T |
| direction of the carbon powders | perpendicular (Z-axis) | horizontal (X-axis) | random | perpendicular (Z-axis) |
| conductivity (W/(m · K)) |  |  |  |  |
| Z-axis direction | 18.4 | 2.9 | 2.9 | 11.6 |
| X-axis direction | 3.5 | 18.2 | 3.4 | 2.9 |
| Y-axis direction | — | 3.1 | — | — |

Example 7

As a polymer matrix, styrenic thermoplastic elastomer (Asahi Kasei Corporation, a tradename Tuftec™ H1053) was used. As thermally conductive filler, the carbon powders of Sample 1 were used. 2000 parts by weight of toluene as a solvent was added to 100 parts by weight of the matrix. Then 60 parts by weight of the carbon powders was mixed and dispersed in the admixture to prepare a thermally conductive composition.

The composition was then injected in a cavity of the metal mold of a predetermined shape. A magnetic field (magnetic flux density of 6 tesla) was applied so that the direction of the magnetic line of force corresponded to the direction perpendicular to a potential thermally conductive molded article (Z-axis direction). After the carbon powders were fully aligned in the composition, the composition was thermally hardened and cooled down. A plate-like thermally conductive molded article having 2 mm×20 mm×20 mm (thickness×depth×width) was produced.

In this molded article, the carbon powders were arranged in the direction perpendicular to the molded article (Z-axis direction). The measured thermal conductivities of the molded body in the perpendicular direction (Z-axis direction) and the horizontal direction (X-axis direction) were 11.8W/(m·K) and 3.2W/(m·K), respectively.

Comparative Example 5

A plate-like thermally conductive molded article was produced as in Example 7, except that the carbon powders of Sample 3 were used as thermally conductive filler.

In this molded article, the carbon powders were arranged in the direction perpendicular to the molded article (Z-axis direction). The measured thermal conductivities of the molded body in the perpendicular direction (Z-axis direction) and the horizontal direction (X-axis direction) were 7.4W/(m·K) and 2.2W/(m·K), respectively.

The thermal conductivities of the molded body of Example 7 and Comparative example 5 are shown in Table 4.

TABLE 4

|  | Ex. 7 | Comp. 5 |
|---|---|---|
| filler | Sample 1 | Sample 3 |
| matrix | elastomer | elastomer |
| magnetic field (T) | 6 T | 6 T |
| direction of the carbon powders | perpendicular (Z-axis) | perpendicular (Z-axis) |
| conductivity (W/(m · K)) |  |  |
| Z-axis direction | 11.8 | 7.4 |
| X-axis direction | 3.2 | 2.2 |
| Y-axis direction | — | — |

(Discussion)

The thermal conductivity in a certain direction (Z-axis or X-axis direction) was much higher in the molded article of Examples 1 and 2 than in that of Comparative example 1 (Table 1). Thus, it was confirmed that by aligning the carbon powders, which are obtained by graphitizing polymeric material having an aromatic ring on its main chain, in a certain direction in the polymer matrix, the thermal conductivity in that direction was greatly improved.

The thermal conductivity was higher in the molded article of Examples 3 and 4 than in that of Comparative example 2 (Table 2). Thus, it was confirmed that the carbon powders (Samples 1 and 2), which are obtained by graphitizing polymeric material having an aromatic ring on its main chain, have greater thermal conductivity than the conventional carbon powders (Sample 3), which are obtained from raw mesophase pitch. Especially, it was confirmed that the thermal conductivity was greatly improved in the direction perpendicular to the molded body (Z-axis direction).

The thermal conductivity in a certain direction (Z-axis or X-axis direction) was much higher in the molded article of Examples 5 and 6 than in that of Comparative example 3 (Table 3). Thus, it was confirmed that the thermal conductivity in a certain direction was greatly improved when the carbon powders are intensively aligned in that direction in the polymer matrix.

The thermal conductivity was higher in the molded article of Example 5 than in that of Comparative example 4 (Table 3). Also, the thermal conductivity was higher in the molded article of Example 7 than in that of Comparative example 5 (Table 4). Thus, it was confirmed that the carbon powders (Sample 1), which are obtained by graphitizing polymeric material having an aromatic ring on its main chain, have greater thermal conductivity than the conventional carbon powders (Sample 3), which are obtained from raw mesophase pitch. Especially, it was confirmed that the thermal conductivity was greatly improved in the direction perpendicular to the molded body (Z-axis direction).

It should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope and equivalence of the appended claims.

The invention claim is:

1. A thermally conductive molded article having the shape of a sheet and produced by molding a conductive composition into a predetermined shape, the composition comprising:
    a polymer matrix; and
    carbon powders, wherein the carbon powders are obtained by (1) pulverizing or cutting a polymeric material and then graphitizing the polymeric material or (2) graphitizing a polymeric material via heating and then pulverizing or cutting the graphitized material, the polymeric material having an aromatic ring on its main chain;
    wherein, the carbon powders have a hexagonal graphite crystal structure; and the carbon powders and the graphite planes of the hexagonal graphite crystal structure are aligned in the polymer matrix in the direction perpendicular to the molded article sheet.

2. The molded article as in claim 1, wherein the polymeric matermal is a polybenzazole fiber, an aromatic polyamnide fiber, an aromatic polyimide fiber, a polyphenylene sulfide fiber, a wholly aromatic polyester fiber, or a mixture thereof.

3. The molded article as in claim 1, wherein the polymeric material is a polybenzazole film, an aromatic polyamide film, an aromatic polyimide film, a polyphenylene sulfide film, a wholly aromatic polyester film, or a mixture thereof.

4. The molded article as in claim 1, wherein the carbon powders have an interplanar spacing (d002) of graphite planes of less than 0.3770 nm by x-ray diffractometry.

5. The molded article as in claim 1, wherein the carbon powders have an average particle size of from 1 to 500 μm.

6. The molded article as in claim 1, wherein the polymer matrix is thermoplastic resin, thermoplastic elastomer, thermosetting resin, vulcanized rubber, or a mixture thereof.

7. A method of making a thermally conductive molded article having the shape of a sheet, the method comrising:
    providing a thermally conductive composition including a polymer matrix and carbon powders, wherein the carbon powders are obtained (1) pulverizing or cutting a polymeric material and then graphitizing the polymeric material or (2) graphitizing a polymerte material via heating and then pulverizing or cutting the graphitized material, the polymeric material having an aromatic ring on its main chain;
    applying a magnetic field to the composition so that the carbon powders are aligned in a certain direction in the polymer matrix; and
    hardening the composition with the carbon powders aligned in the certain direction;
    wherein the carbon powders have a hexagonal graphite crystal structure; and the carbon powders and the graphite planes of the gexagonal graphite crystal structure are alignein the polymer matrix in the direction perpendicular to the molded article sheet.

8. The method as in claim 7, wherein the carbon powders are graphitized by heating the polymeric material at least 2500 degree C. under vacuum or in an inert gas.

9. The method as in claim 7, wherein the polymeric material is a polybenzazole fiber, an aromatic polyamide fiber, an aromatic polyimide fiber, a polyphenylene sulfide fiber, a wholly aromatic polyester fiber, or a mixture thereof.

10. The method as in claim 7, wherein the polymeric material is a ploybenzazole film, an aromatic polyamide film, an, aromatic polyimide film, a polyphenylene sulfide film, a wholly aromatic polyester film, or a mixture thereof.

* * * * *